United States Patent
Wang et al.

(10) Patent No.: US 6,536,653 B2
(45) Date of Patent: Mar. 25, 2003

(54) ONE-STEP BUMPING/BONDING METHOD FOR FORMING SEMICONDUCTOR PACKAGES

(75) Inventors: Hsing-Seng Wang, Tauyuan (TW); Rong-Shen Lee, Hsinchu (TW); Chiang-Han Day, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/761,298

(22) Filed: Jan. 16, 2001

(65) Prior Publication Data

US 2002/0092894 A1 Jul. 18, 2002

(51) Int. Cl.⁷ .................. B23K 31/00; B23K 31/02; B23K 35/12
(52) U.S. Cl. .............. 228/180.22; 228/179.1; 228/245
(58) Field of Search .............. 228/180.22, 179.1, 228/180.1, 180.21, 245

(56) References Cited

U.S. PATENT DOCUMENTS

| | | | | |
|---|---|---|---|---|
| 5,275,330 A | * | 1/1994 | Isaacs et al. | 228/180.21 |
| 5,435,480 A | * | 7/1995 | Hart et al. | 174/264 |
| 6,098,283 A | * | 8/2000 | Goetsch et al. | 174/263 |
| 6,199,273 B1 | * | 3/2001 | Kubo et al. | 174/250 |
| 6,252,779 B1 | * | 6/2001 | Pierson et al. | 29/840 |

* cited by examiner

Primary Examiner—Tom Dunn
Assistant Examiner—Zidia Pittman
(74) Attorney, Agent, or Firm—Tung & Associates

(57) ABSTRACT

A one-step bumping/bonding process for forming a semiconductor package is disclosed. In the method, a first electronic substrate which has either a plurality of conductive pads or a plurality of recessed openings formed on top of a plurality of apertures through the substrate is first provided and aligned with a second electronic substrate that has a plurality of conductive pads with each aperture aligned to a conductive pad on the second substrate. A plurality of solder balls is then planted on top of the plurality of conductive pads or the plurality of recessed openings on the surface of the first electronic substrate by a pick-and-place technique. Alternatively, a plurality of solder paste may be printed by a thick film stencil printing process similarly in place of the plurality of solder balls. After a solder reflow process, the solder balls placed on top of the apertures is reflown into the apertures forming solder plugs and making electrical connection with the conductive pads on the second electronic substrate thus completing the one-step bumping/bonding process for forming a semiconductor package. The electronic substrate may be either a printed circuit board or a silicon wafer.

27 Claims, 4 Drawing Sheets

ONE-STEP BUMPING/BONDING METHOD FOR FORMING SEMICONDUCTOR PACKAGES

FIELD OF THE INVENTION

The present invention generally relates to a method for forming semiconductor packages and more particularly, relates to a one-step process for forming semiconductor packages in which a bumping step and a bonding step are carried out simultaneously.

BACKGROUND OF THE INVENTION

In the fabrication of modern semiconductor devices, the ever increasing device density and decreasing device dimensions demand more stringent requirements in the packaging or interconnecting techniques in the high density devices. Conventionally, a flip-chip attachment method is in packaging semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become more difficult.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A–1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UBM layer 26 improves bonding between a solder ball to be formed and the top surface 18 of the bond pad 14.

In the next step of the process, as shown in FIG. 1C, a photoresist layer 34 is deposited on top of the UBM layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

A large number of IC chips are designed with a peripheral array of I/O pads. For modern high density devices, the pitch allowed between I/O pads is steadily decreasing. An I/O pad redistribution process is frequently necessary for changing a peripheral array to an area array in order to improve pitch between the conductive pads. During the redistribution process, metal traces are frequently used to extend bond pads from a peripheral area to a center area on the chip. Due to the limited space available for the metal traces, especially those traces that run an extended distance, it is desirable to produce metal traces that are stress buffered in order to assure the reliability of a chip.

The conventional flip chip bonding process requires multiple preparation steps for IC chips, i.e. the formation of aluminum bond pads on the chip, the under-bump-metallurgy process on the bond pads and the deposition of solder required in the bumping process. The substrate that the IC chip is bonded to requires a flux coating in order to ensure an acceptable bond strength is formed between the solder bumps and the conductive elements on the substrate surface. The flip chip bonding process further requires a reflow process for the bumps, a flux cleaning process to eliminate excess flux material from the surface of the bump, a drying process after the cleaning process, an underfill process for dispensing an underfill material, and an underfill curing process to minimize thermal stresses in the underfill and in the joint formed.

The conventional method for depositing solder bumps described above therefore presents a number of processing difficulties. For instance, one of the difficulties is the large volume of solder used to form a mushroom-shaped bump which impedes the process of making fine-pitched bumps. Another difficulty is the requirement of a flux coating step to ensure adhesion between a bump pad and a solder bump. The requirement of a solder reflow process further complicates the flip chip bonding method and increases its costs. It is therefore desirable to implement a flip chip bonding process that does not require separate processing steps for forming solder bumps, for reflowing solder bumps, and for bonding the bumps to a substrate.

It is therefore an object of the present invention to provide a one-step bumping/bonding method for forming semiconductor packages that does not have the drawbacks or shortcomings of the conventional method.

It is another object of the present invention to provide a one-step bumping/bonding method for forming semiconductor packages in which the formation of solder bumps and the bonding of an IC device to a substrate are carried out simultaneously.

It is a further object of the present invention to provide a one-step bumping/bonding method for forming semiconductor packages that does not require an intermediate underfill process.

It is another further object of the present invention to provide a one-step bumping/bonding method for forming semiconductor packages that is simplified than either a wire bonding or a flip chip bonding method.

It is still another object of the present invention to provide a one-step bumping/bonding method for forming semiconductor packages by planting solder balls on a plurality of bond pads situated on a semiconductor wafer.

It is yet another object of the present invention to provide a one-step bumping/bonding method that is applicable to 3-D packaging, ultra-thin packaging and direct chip attachment techniques.

SUMMARY OF THE INVENTION

In accordance with the present invention, a one-step bumping/bonding process for forming a semiconductor package is provided.

In a preferred embodiment, a one-step bumping/bonding process for forming a semiconductor package can be carried out by the operating steps of providing a first electronic substrate that has a first plurality of apertures therethrough, the substrate is formed of a first insulating material with a recess in a top surface of the substrate surrounding an opening forming a recessed opening for each of the first plurality of apertures; providing a second electronic substrate that has a first plurality of conductive pads formed on a top surface insulated from each other by an insulating material, one of the first and second electronic substrates being a silicon wafer while the other being a printed circuit board (PCB); positioning the first electronic substrate juxtaposed to the second electronic substrate such that each opening of the first plurality of apertures faces each of the first plurality of conductive pads; depositing onto each of the recessed openings for the first plurality of apertures a solder ball; and reflowing the solder ball forming a first plurality of solder bumps filling the apertures and a space in-between the first and the second electronic substrate forming an electrical passageway between each of the recessed openings and each of the first plurality of conductive pads.

The one-step bumping/bonding process for forming a semiconductor package may further include the step of providing the first electronic substrate in a silicon wafer and providing the second electronic substrate in a printed circuit board. The method may further include the step of forming the first plurality of apertures by laser drilling or by a micro-electro-mechanical-system machining. The depositing step for the solder ball may be carried out by a pick-and-place technique. The method may further include the step of reflowing the solder ball at a temperature higher than a reflow temperature of the solder material. The method may further include the step of depositing solder flux into each of the recessed openings of the first plurality of apertures. The method may further include the step of removing at least one-third of the total thickness of the first electronic substrate on an inactive side prior to the positioning step, or the step of coating a sidewall in the first plurality of apertures with an adhesion promoter prior to depositing the solder ball onto the recessed opening, or the step of forming a first plurality of conductive pads on the recessed openings when the first electronic substrate is a silicon wafer prior to depositing the solder ball.

The present invention is further directed to a one-step bumping/bonding process for forming semiconductor packaging which can be carried out by the operating steps of providing a first electronic substrate that has a first plurality of conductive pads formed on a first surface insulated from each other by a first insulating material layer; forming a first plurality of apertures through the first electronic substrate, the first plurality of conductive pads and the first insulating material layer with one apertures corresponding to each conductive pad; providing a second electronic substrate having a second plurality of conductive pads formed on a second surface insulated from each other by a second insulating material layer, the first plurality being equal to or different than the second plurality, one of the first and second electronic substrates being a silicon wafer, while the other being a printed circuit board; positioning the first electronic substrate juxtaposed to the second electronic substrate such that the first plurality of conductive pads faces the second plurality of conductive pads; depositing onto each of the first plurality of conductive pads a solder ball; and reflowing the solder ball forming a first plurality of solder plugs in-between the first and second electronic substrates electrically connecting one of the first plurality of conductive pads to one of the second plurality of conductive pads, respectively.

The one-step bumping/bonding process for forming a semiconductor package may further include the step of providing the first electronic substrate in a silicon wafer and providing the second electronic substrate in a printed circuit board, or the step of forming the first plurality of apertures by laser drilling or by a micro-electro-mechanical-system machining. The depositing step for the solder ball may be carried out by a pick-and-place technique. The method may further include the step of reflowing the solder ball at a temperature higher than the reflow temperature of the solder material. The method may further include the step of depositing solder flux onto each of the first plurality of conductive pads to facilitate the reflow of the solder ball. The method may further include the step of removing at least one-third of the total thickness of the first electronic substrate on an inactive side prior to the aperture forming step. The method may further include the step of coating a sidewall in the first plurality of apertures with an adhesion promoter prior to depositing the solder balls on the first plurality of conductive pads. The method may further include the step of depositing and patterning an under-bump-metallurgy layer onto the first plurality of conductive pads when the first electronic substrate is a silicon wafer prior to depositing the solder ball. The method may further include the step of providing the first electronic substrate in a printed circuit board and the second electronic substrate in a silicon wafer.

The present invention is still further directed to a one-step bumping/bonding process for forming semiconductor packaging which can be carried out by the steps of providing a first electronic substrate that has a first plurality of conductive pads formed on a first surface insulated from each other by a first insulating material layer; forming a first plurality of apertures through the first electronic substrate, the first plurality of conductive pads and the first insulating material layer with one aperture corresponding to each conductive pad; providing a second electronic substrate that has a second plurality of conductive pads formed on a second surface insulated from each other by a second insulating material layer, the first plurality being equal to or different than the second plurality, one of the first and second electronic substrates being a silicon wafer, while the other being a printed circuit board; positioning the first electronic substrate juxtaposed to the second electronic substrate such that the first plurality of conductive pads faces the second plurality of conductive pads; depositing onto each of the first plurality of conductive pads a solder bump; and reflowing the solder bump forming a first plurality of solder plugs filling the first plurality of apertures and a space in-between the first and second electronic substrates and electronically connecting the first plurality of conductive pads to the second plurality of conductive pads.

The one-step bumping/bonding process for forming semiconductor packaging may further include the step of providing the first electronic substrate in a silicon wafer and providing the second electronic substrate in a printed circuit board, or the step of forming the first plurality of apertures by laser drilling or by micro-electro-mechanical-system machining. The depositing step for the solder bump may be carried out by a thick film printing or by a stencil printing technique. The method may further include the step of reflowing the solder bump at a temperature higher than a reflow temperature of the solder material, or the step of depositing solder flux onto the first plurality of conductive pads prior to the solder bump depositing step. The method may further include the step of coating a sidewall in the first plurality of apertures with an adhesion promoter prior to depositing the solder bump.

BRIEF DESCRIPTION OF THE DRAWINGS

These objects, features and advantages of the present invention will become apparent from a close examination of the following specification and the appended drawings in which.

DETAILED DESCRIPTION OF THE PREFERRED EMBODIMENT

Figure 1A:
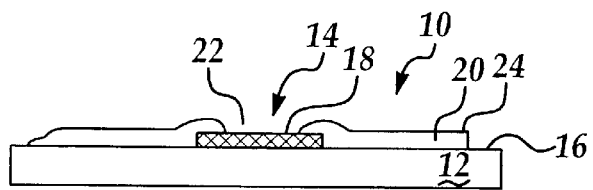
FIG. 1A is an enlarged, cross-sectional view of a conventional pre-processed semiconductor substrate which has a bond pad and a passivation layer formed on top.
Figure 1B:
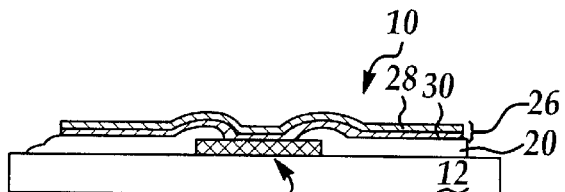
FIG. 1B is an enlarged, cross-sectional view of the conventional semiconductor structure of FIG. 1A with an under-bump-metallurgy layer formed on top.
Figure 1C:
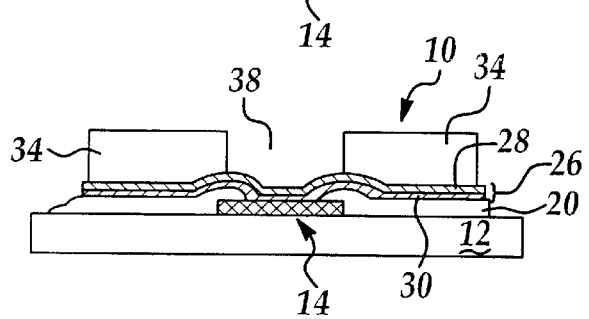
FIG. 1C is an enlarged, cross-sectional view of the conventional semiconductor structure of FIG. 1B with a photoresist layer deposited and defined on top.
Figure 1D:
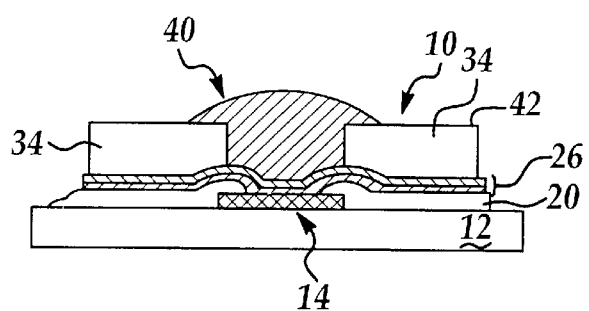
FIG. 1D is an enlarged, cross-sectional view of the conventional semiconductor structure of FIG. 1C with a solder material deposited in the window opening for the solder bump.
Figure 1E:
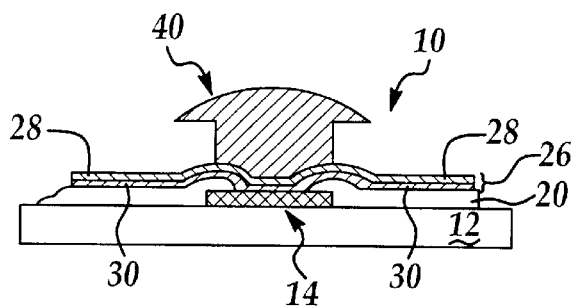
FIG. 1E is an enlarged, cross-sectional view of the conventional semiconductor structure of FIG. 1D with the photoresist layer removed by a wet etching process.
Figure 1F:
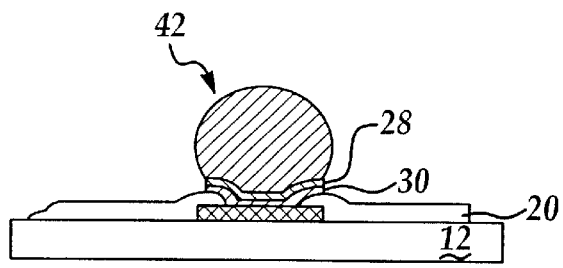
FIG. 1F is an enlarged, cross-sectional view of the conventional semiconductor structure of FIG. 1E with the exposed UBM layer removed and the solder bump reflown into a solder ball.

The present invention discloses a single-step bumping/bonding method for forming semiconductor packages and the packages formed by the simultaneous bumping/bonding method.

In the method, the one-step bumping/bonding for forming semiconductor packages can be carried out by first providing an electronic substrate that has either a first plurality of recessed openings or a first plurality of conductive pads formed on a first surface insulated from each other by a first insulating material layer, then forming a first plurality of apertures through the first electronic substrate, the first plurality of recessed openings or conductive pads, and the first insulating material layer with one aperture formed corresponds to each conductive pad, then providing a second electronic substrate that has a second plurality of conductive pads formed on a second surface insulated from each other by a second insulating material layer, the first plurality may be equal to or different from the second plurality, one of the electronic substrates is a silicon wafer, while the other electronic substrate is a printed circuit board. The step for forming the first plurality of apertures may be accomplished by a technique such as laser drilling, micro-electro-mechanical-system machining, or other suitable method. A solder ball or a solder bump may be deposited onto either the plurality of conductive pads or the plurality of recessed openings by a technique of either pick-and-place or stencil printing, respectively.

The invention is further directed to a semiconductor package formed of two electronic substrates that are electrically and mechanically connected together by solder bumps formed between the substrates which include a first electronic substrate that has either a first plurality of recessed openings or a first plurality of conductive pads, i.e. I/O pads, formed on a first surface insulated by a first insulating material layer; the first electronic substrate further having a first plurality of apertures through the substrate, the first plurality of conductive pads and the first insulating material layer with one aperture formed in each conductive pad; a second electronic substrate that has a second plurality of conductive pads formed on a second surface insulated by a second insulating material layer, the first plurality may be equal to or different than the second plurality, one of the first and the second electronic substrates is a silicon wafer, while the other is a printed circuit board; and a first plurality of solder bumps mechanically and electrically connecting the first plurality of conductive pads to the second plurality of conductive pads thus forming the semiconductor package.

In the semiconductor package formed by the present invention novel method, one of the electronic substrates may be a silicon wafer while the other may be a printed circuit board. When the electronic substrate is a silicon wafer, the plurality of conductive pads may further include a layer of solder flux or under-bump-metallurgy (UBM) material deposited on top. When the electronic substrate is a silicon wafer, the insulating material layer deposited for providing insulation between conductive pads may be a passivation material layer. When the electronic substrate is a printed circuit board, the insulating material layer may be a solder mask. In each of the plurality of apertures formed in the silicon wafer, the sidewall may be further coated with an adhesion promoter by a plating method. In the semiconductor package, a plurality of solder balls may have been reflown into a plurality of solder plugs filling the apertures.

Figure 2:
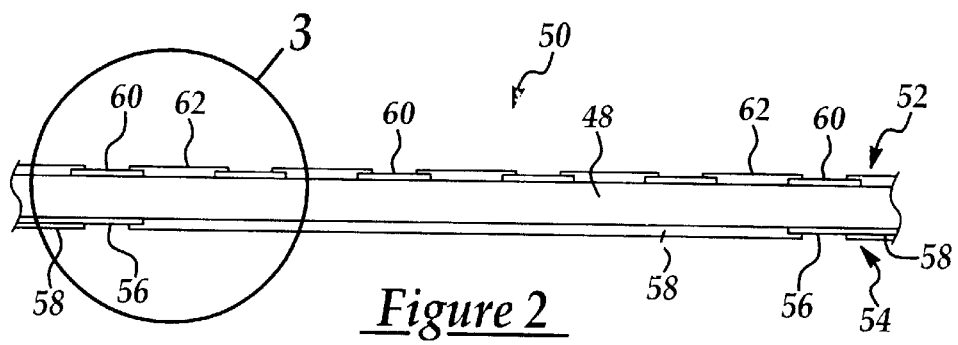
FIG. 2 is an enlarged, cross-sectional view of a present invention electronic substrate that is equipped with a plurality of conductive pads and conductive traces.

Referring now to FIG. 2, wherein a present invention electronic substrate 50 which has a top surface 52 and a bottom surface 54 is shown. On the bottom surface 54, a plurality of metal traces 56 is formed for providing electrical communication with other devices on the electronic substrate 50. The metal traces 56 are formed of an electrically conductive metallic material for inputting/outputting electrical signals to the substrate 50. The metal traces 56 are insulated by an insulating material layer 58 such that the metal traces 56 are only partially exposed.

On the top surface 52 of the electronic substrate 50, a plurality of conductive pads 60, or bond pads, is provided and insulated by an insulating material layer 62. The conductive pads 60 may be formed of a similar material as the metal traces 56, i.e. of aluminum, copper or alloys thereof. The body portion 48 of the electronic substrate 50 is also formed of a dielectric, or electrically insulating material.

Figure 3:
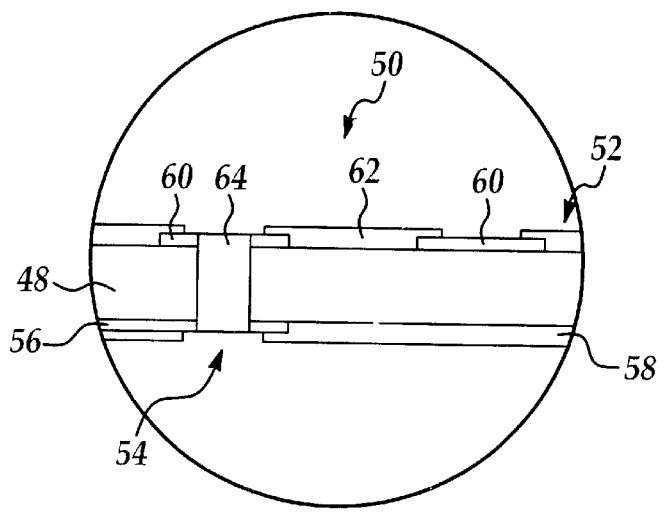
FIG. 3 is a partial, enlarged, cross-sectional view of the present invention electronic substrate of FIG. 2 having an apertures formed through a conductive pad, an insulating material and a conductive trace.

In the next step of the process, as shown in FIG. 3, an aperture 64 is formed through the insulating material layer 48 and the conductive pad 60, the metal trace 56. It should be noted that, while in FIGS. 2 and 3 the conductive pads 60 are shown, such pads or bond pads are not an absolute necessary component of the present invention method. The conductive pad 60 can be left out and simply replaced by a volume of a solder flux material in its place. The solder flux material facilitates the adhesion of a solder ball or a solder bump thereon, and furthermore, facilitates the reflow of the solder material during a subsequent reflow process. It should further be noted that, such alternate embodiment of not using a conductive pad is not shown in the Figures. The aperture 64 can be advantageously provided by a technique such as laser drilling or micro-electro-mechanical-system (MEMS) machining. The dimension, or diameter of the aperture 64 can be formed of any suitable size. However, it is desirable that the aperture has a diameter of less than 100 $\mu$m such that a capillary effect will take place during the solder reflow process to completely fill the aperture by a solder ball placed on top of the electronic substrate 50.

Figure 4:
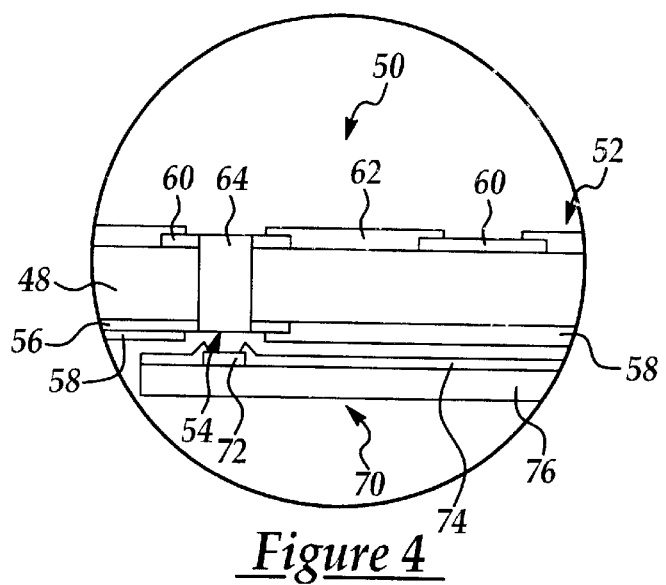
FIG. 4 is a partial, enlarged, cross-sectional view of the present invention substrate of FIG. 3 positioned over a second electronic substrate with the aperture aligned with a conductive pad on the second electronic substrate.

FIG. 4 illustrates the next step of an alignment process for aligning the electronic substrate 50 with a second electronic substrate 70 such that the aperture 64 is positioned juxtaposed to the conductive pad 72 formed on the second electronic substrate 70. It should be noted that the conductive pad 72 is insulated by an insulating material layer 74 that is coated on a substrate 76. The alignment process further aligns other apertures (not shown) with other conductive pads (not shown) on the second electronic substrate 70.

Figure 5:
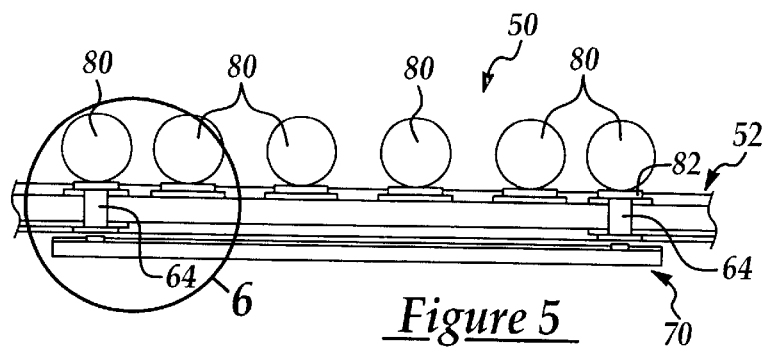
FIG. 5 is an enlarged, cross-sectional view of the present invention electronic substrate aligned with a second electronic substrate and having a plurality of solder balls planted on top of a plurality of conductive pads.
Figure 6:
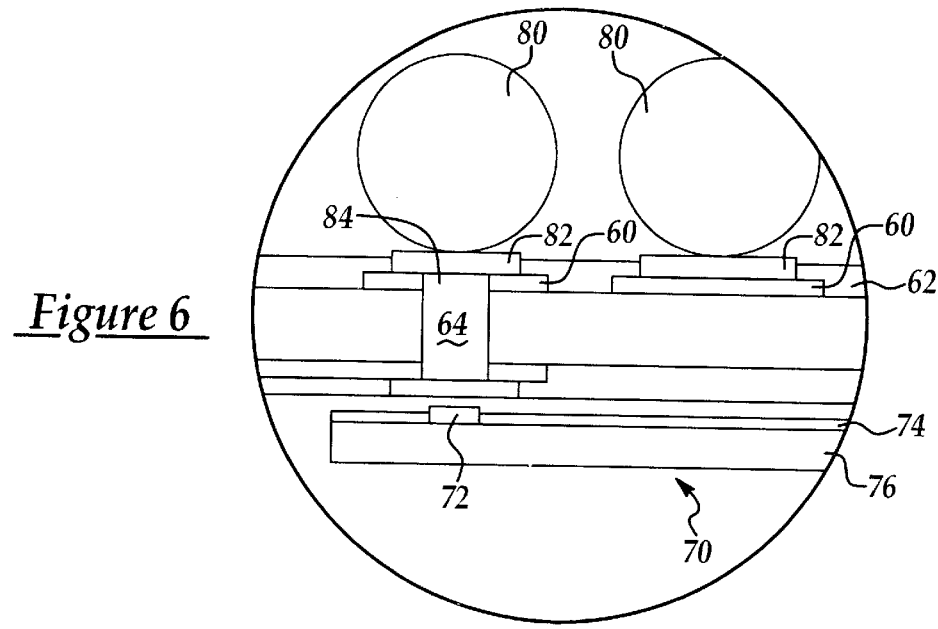
FIG. 6 is a partial, enlarged, cross-sectional view of the present invention electronic substrate of FIG. 5 illustrating a solder ball planted on top of a solder flux and a conductive pad on the electronic substrate.

After the alignment process between the first electronic substrate 50 and the second electronic substrate 70 is completed, wherein the first electronic substrate may be a printed circuit board and the second electronic substrate may be a silicon wafer, a plurality of solder balls 80 may be planted on the top surface 52 of the first electronic substrate 50. This is shown in FIG. 5 and in a partial, enlarged view of FIG. 6. A flux layer 82 is first applied, either on the conductive pad 60 or in the recessed opening 84 (when the conductive pad 60 is not in existence), to facilitate the reflow of the solder ball 80 in a subsequent reflowing process for filling the apertures 64 and making electrical connection with conductive pad 72 on the second electronic substrate 70. As previously explained, the use of the conductive pad 60 is optional and when the pad is nonexistent, only a recessed opening 84 is provided at each apertures 64 for receiving the flux material 82.

The planting of the solder balls 80 can be carried out by any established method, such as a pick-and-place technique or any other mold transfer technique.

Figure 7:
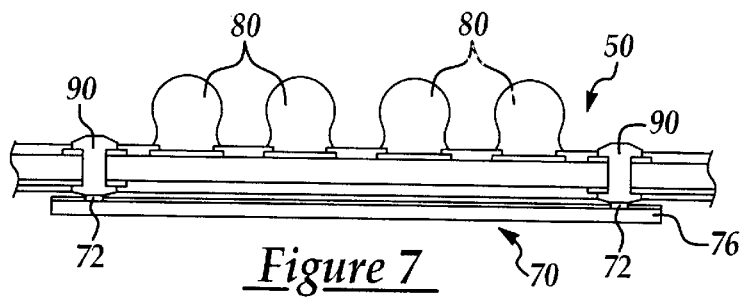
FIG. 7 is an enlarged, cross-sectional view of the present invention electronic substrate and a second electronic substrate after a reflow process wherein the solder ball forms a solder plug connecting the two substrates.

In the final process step, a reflow for the solder balls 80 can be carried out at a temperature that is higher than the reflow temperature of the solder material. This is shown in FIG. 7. Solder balls 80, at the two ends of the electronic substrate 50, have flown into the apertures 64 and therefore forming a solder plug 90 making electrical connection with the conductive pads 72 situated on the second electronic substrate 70. The present invention novel one-step bumping/bonding process is thus completed. It should also be noted that the solder balls 80, in the middle of the electronic substrate 50 as shown in FIG. 7, have also reflown to a small extent and improved their bonding with the conductive pads 60.

The present invention first preferred embodiment of forming solder balls on top of a flux layer and a conductive pad as shown in FIGS. 2–7; and a second preferred embodiment of forming solder balls on top of a flux layer and a recessed opening for the apertures (not shown in the figures) have therefore been amply described. In the third preferred embodiment, as shown in FIGS. 8–10, a plurality of solder bumps, instead of solder balls, is formed on top of the first electronic substrate.

Figure 8:
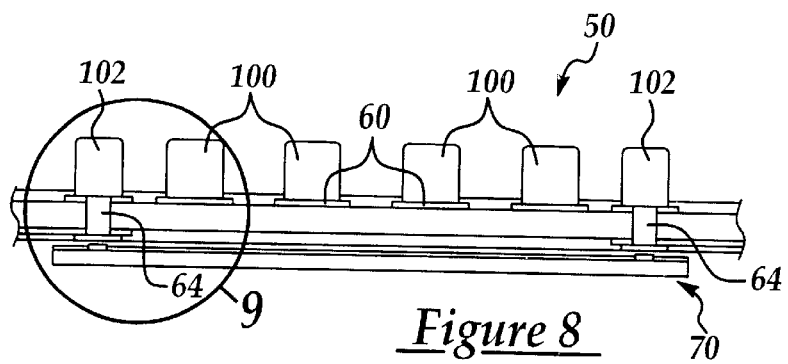
FIG. 8 is an enlarged, cross-sectional view of the present invention electronic substrate positioned on top of a second electronic substrate and having a plurality of solder bumps stencil printed on a top surface.

As shown in FIG. 8, a plurality of solder bumps 100 and 102 is formed on top of the first electronic substrate 50. The solder bumps 100,102 may be suitably formed by a thick film printing, or a stencil printing process in a low cost fabrication method. A solder paste containing Pb and Sn is normally used which also contains a solvent as a binder. The paste, when mixed with suitable viscosity or consistency, can be easily stencil printed on top of the electronic substrate 50 at selected locations, i.e. over the apertures 64 or on top of the conductive pads 60.

Figure 9:
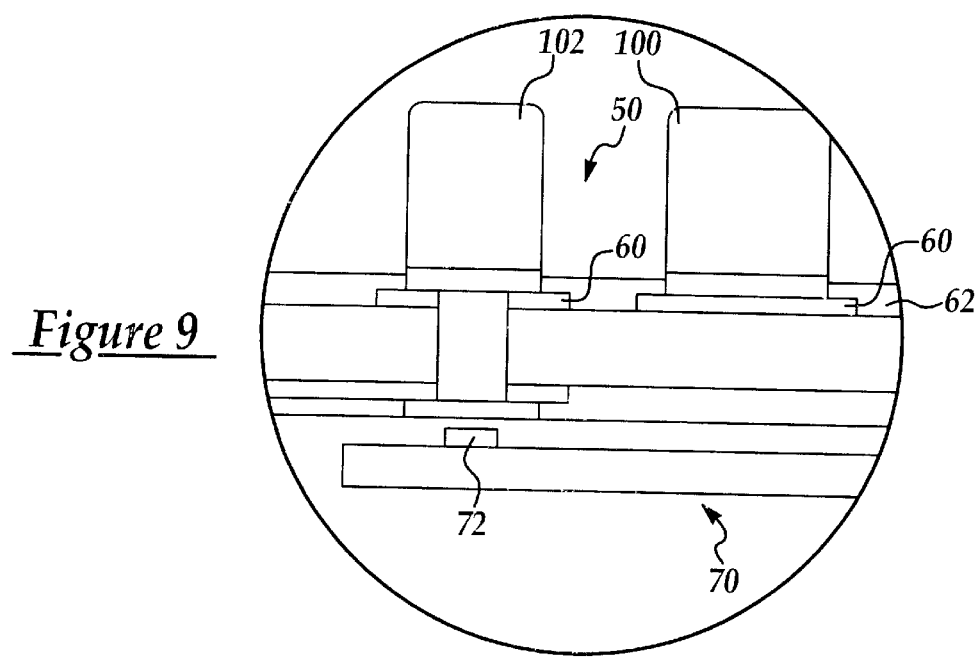
FIG. 9 is a partial, enlarged, cross-sectional view of the present invention electronic substrate of FIG. 8 illustrating a thick film printed solder bump on top of a conductive pad formed on the electronic substrate.
Figure 10:
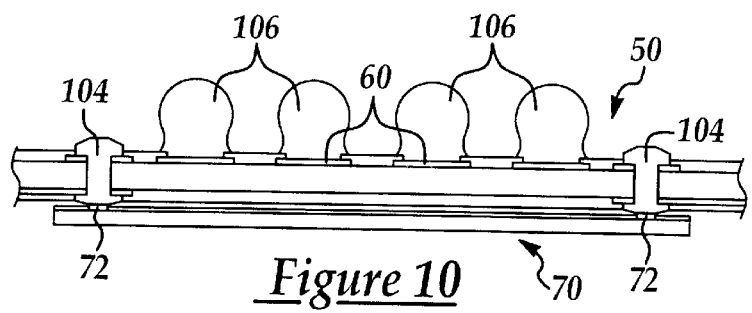
FIG. 10 is an enlarged, cross-sectional view of the present invention electronic substrate of FIG. 8 after a solder reflow process wherein solder plugs are formed connecting the two substrates.

In a partial, enlarged, cross-sectional view shown in FIG. 9, the solder bump 102 is placed on top of a flux layer (not shown) and a conductive pad 60, while solder bump 100 is placed directly on a conductive pad 60. After a solder reflow process is conducted at a suitable reflow temperature, such as just above the melting point of the solder material, the solder bump 102 flows into apertures 64 by a capillary effect in forming solder plugs 104 and making electrical connection with conductive pads 72 situated on the second electronic substrate 70. This is shown in FIG. 10. The solder bumps 100 on top of the conductive pads 60 also reflow into solder balls 106 after the reflow process. The present invention one-step bumping/bonding process is thus completed by the formation of the solder plugs 104 from the solder bump 102. It should be noted that, in this third preferred embodiment, the amount of solder bump 100,102 formed on top of the first electronic substrate 50 can be suitably adjusted by changing the hole dimensions in the stencil during the stencil printing process.

The present invention novel method for forming a one-step bumping/bonding process by either planting solder balls or printing solder bumps on top of an electronic substrate has therefore been amply described in the above description and in the appended drawings of FIGS. 2–10.

While the present invention has been described in an illustrative manner, it should be understood that the terminology used is intended to be in a nature of words of description rather than of limitation.

Furthermore, while the present invention has been described in terms of a preferred embodiments, it is to be appreciated that those skilled in the art will readily apply these teachings to other possible variations of the inventions.

The embodiment of the invention in which an exclusive property or privilege is claimed are defined as follows.

What is claimed is:

1. A one-step bumping/bonding process for forming semiconductor packaging comprising the steps of:

providing a first electronic substrate having a first plurality of apertures therethrough, said substrate being formed of a first insulating material with a recess in a top surface of said substrate surrounding an opening forming a recessed opening for each of said first plurality of apertures;

providing a second electronic substrate having a first plurality of conductive pads formed on a top surface insulated from each other by an insulating material, one of said first and second electronic substrates being a silicon wafer while the other being a printed circuit board (PCB);

positioning said first electronic substrate juxtaposed to said second electronic substrate such that each opening of said first plurality of apertures faces each of said first plurality of conductive pads;

depositing onto each of said recessed openings or said first plurality of apertures a solder ball; and reflowing said solder ball forming a first plurality of solder bumps filling said apertures and a space in-between said first and second electronic substrates forming an electrical passageway between each of said recessed openings and each of said first plurality of conductive pads.

2. A one-step bumping/bonding process for forming semiconductor packaging according to claim 1 further comprising the step of providing said first electronic substrate in a silicon wafer and providing said second electronic substrate in a printed circuit board.

3. A one-step bumping/bonding process for forming semiconductor packaging according to claim 1 further comprising the step of forming said first plurality of apertures by laser drilling or by a micro-electro-mechanical-system (MEMS)machining.

4. A one-step bumping/bonding process for forming semiconductor packaging according to claim 1, wherein said depositing step for said solder ball being carried out by a pick-and-place technique.

5. A one-step bumping/bonding process for forming semiconductor packaging according to claim 1, further comprising the step of reflowing said solder ball at a temperature higher than a reflow temperature of the solder material.

6. A one-step bumping/bonding process for forming semiconductor packaging according to claim 1 further comprising the step of depositing solder flux into each of said recessed openings of said first plurality of apertures.

7. A one-step bumping/bonding process for forming semiconductor packaging according to claim 1 further comprising the step of removing at least ⅓ of the total thickness of said first electronic substrate on an inactive side prior to said positioning step.

8. A one-step bumping/bonding process for forming semiconductor packaging according to claim 1 further comprising the step of coating a sidewall in said first plurality of apertures with an adhesion promoter prior to depositing said solder ball onto said recessed opening.

9. A one-step bumping/bonding process for forming semiconductor packaging according to claim 1 further comprising the step of forming a first plurality of conductive pads on said recessed openings when said first electronic substrate is a silicon wafer prior to depositing said solder balls.

10. A one-step bumping/bonding process for forming semiconductor packaging comprising the steps of:

providing a first electronic substrate having a first plurality of conductive pads formed on a first surface insulated from each other by a first insulating material layer;

forming a first plurality of apertures through said first electronic substrate, said first plurality of conductive pads and said first insulating material layer with one aperture corresponds to each conductive pad;

providing a second electronic substrate having a second plurality of conductive pads formed on a second surface insulated from each other by a second insulating material layer, said first plurality being equal to or different than said second plurality, one of said first and second electronic substrates being a silicon wafer while the other being a printed circuit board (PCB);

positioning said first electronic substrate juxtaposed to said second electronic substrate such that said first plurality of conductive pads faces said second plurality of conductive pads;

depositing onto each of said first plurality of conductive pads a solder ball; and reflowing said solder ball forming a first plurality of solder plugs in-between said first and second electronic substrates electrically connecting one of said first plurality of conductive pads to one of said second plurality of conductive pads, respectively.

11. A one-step bumping/bonding process for forming semiconductor packaging according to claim 10 further comprising the step of providing said first electronic substrate in a silicon wafer and providing said second electronic substrate in a PCB.

12. A one-step bumping/bonding process for forming semiconductor packaging according to claim 10 further comprising the step of forming said first plurality of apertures by laser drilling or by a micro-electro-mechanical-system (MEMS) machining.

13. A one-step bumping/bonding process for forming semiconductor packaging according to claim 10, wherein said depositing step for said solder ball being carried out by a pick-and-place technique.

14. A one-step bumping/bonding process for forming semiconductor packaging according to claim 10 further comprising the step of reflowing aid solder ball at a temperature higher than a reflow temperature of the solder material.

15. A one-step bumping/bonding process for forming semiconductor packaging according to claim 10 further comprising the step of depositing solder flux onto each of said first plurality of conductive pads to facilitate the reflow of said solder ball.

16. A one-step bumping/bonding process for forming semiconductor packaging according to claim 10 further comprising the step of removing at least ⅓ of the total thickness of said first electronic substrate on an inactive side prior to said aperture forming step.

17. A one-step bumping/bonding process for forming semiconductor packaging according to claim 10 further comprising the step of coating a sidewall in said first plurality of apertures with an adhesion promoter prior to depositing said solder balls on said first plurality of conductive pads.

18. A one-step bumping/bonding process for forming semiconductor packaging according to claim 10 further comprising the step of depositing and patterning an under-bump-metallurgy (UBM) layer onto said first plurality of conductive pads when said first electronic substrate is a silicon wafer prior to depositing said solder ball.

19. A one-step bumping/bonding process for forming semiconductor packaging according to claim 10 further comprising the step of providing said first electronic substrate in a printed circuit board and said second electronic substrate in a silicon wafer.

20. A one-step bumping/bonding process for forming semiconductor packaging comprising the steps of:

providing a first electronic substrate having a first plurality of conductive pads formed on a first surface insulated from each other by a first insulating material layer;

forming a first plurality of apertures through said first electronic substrate, said first plurality of conductive pads and said first insulating material layer with one aperture corresponds to each conductive pad;

providing a second electronic substrate having a second plurality of conductive pads formed on a second surface insulated from each other by a second insulating material layer, said first plurality being equal to or different than said second plurality, one of said first and second electronic substrates being a silicon wafer while the other being a printed circuit board (PCB);

positioning said first electronic substrate juxtaposed to said second electronic substrate such that said first plurality of conductive pads faces said second plurality of conductive pads;

depositing onto each of said first plurality of conductive pads a solder paste; and reflowing said solder paste forming a first plurality of solder plugs filling said first plurality of apertures and a space in-between said first and second electronic substrates electrically connecting said first plurality of conductive pads to said second plurality of conductive pads.

21. A one-step bumping/bonding process for forming semiconductor packaging according to claim 20 further comprising the step of providing said first electronic substrate in a silicon wafer and providing said second electronic substrate in a PCB.

22. A one-step bumping/bonding process for forming semiconductor packaging according to claim 20 further comprising the step of forming said first plurality of apertures by laser drilling or by micro-electro-mechanical-system (MEMS) machining.

23. A one-step bumping/bonding process for forming semiconductor packaging according to claim 20, wherein said depositing step for said solder paste being carried out by a thick film printing or by a stencil printing technique.

24. A one-step bumping/bonding process for forming semiconductor packaging according to claim 20 further comprising the step of reflowing said solder paste at a temperature higher than a reflow temperature of the solder material.

25. A one-step bumping/bonding process for forming semiconductor packaging according to claim 20 further comprising the step of depositing solder flux onto each of said first plurality of conductive pads prior to said solder paste depositing step.

26. A one-step bumping/bonding process for forming semiconductor packaging according to claim 20 further comprising the step of coating a sidewall in said first plurality of apertures with an adhesion promoter prior to depositing said solder paste.

27. A one-step bumping/bonding process for forming semiconductor packaging comprising the steps of:

providing a first electronic substrate having a first plurality of apertures therethrough, said substrate being formed of a first insulating material with a recess in a top surface of said substrate surrounding an opening forming a recessed opening for each of said first plurality of apertures;

providing a second electronic substrate having a first plurality of conductive pads formed on a top surface insulated from each other by a first insulating material, said second electronic substrate further having a second plurality of conductive pads formed on a bottom surface insulated from each other by a second insulating material, one of said first and second electronic substrates being a silicon wafer while the other being a printed circuit board (PCB);

positioning said first electronic substrate juxtaposed to said second electronic substrate such that each opening of said first plurality of apertures faces each of said first plurality of conductive pads;

depositing onto each of said recessed openings or said first plurality of apertures a solder ball; and reflowing said solder ball forming a first plurality of solder bumps filling said apertures and a space in-between said first and second electronic substrates forming an electrical passageway between each of said recessed openings and each of said first plurality of conductive pads.

* * * * *